United States Patent [19]

Birrittella

[11] Patent Number: 4,580,244

[45] Date of Patent: Apr. 1, 1986

[54] BIPOLAR MEMORY CELL

[75] Inventor: Mark S. Birrittella, Phoenix, Ariz.

[73] Assignee: Motorola, Inc., Schaumburg, Ill.

[21] Appl. No.: 622,819

[22] Filed: Jun. 21, 1984

[51] Int. Cl.⁴ .............................................. G11C 11/40
[52] U.S. Cl. .................................... 365/154; 365/179;
307/289
[58] Field of Search ............... 365/154, 174, 189, 179;
307/289

[56] References Cited

U.S. PATENT DOCUMENTS 4,311,925 1/1982 Chang et al. ....................... 307/289

Primary Examiner—Terrell W. Fears
Attorney, Agent, or Firm—William E. Koch

[57] ABSTRACT

A monolithically integrated memory cell having an improved clamped diode load is provided for improving write pulse width and write recovery times. A pair of latchable cross-coupled multi-emitter NPN transistors have a first emitter connected to a stand-by current drain line, and a second emitter coupled to a first bit line and a second bit line, respectively. The base of each transistor is cross-coupled to the collector of the other transistor. The base of each transistor is further coupled to the select line by a PNP transistor. The base of each PNP transistor is coupled to the collector of the respective cross-coupled transistor and is further coupled to the select line by a diode connected NPN transistor. The architecture of the diode connected NPN transistor in the chip prevents substantial stored charge buildup in the epi layer resulting in a lower voltage margin than previously known PN diode or PNP transistor loaded cells, and a higher voltage margin than the previously known Schottky diode loaded cell without the disturb sensitivity.

14 Claims, 4 Drawing Figures

BIPOLAR MEMORY CELL

BACKGROUND OF THE INVENTION

1. Field of the Invention

This invention relates generally to bipolar memory cells and, more particularly, to a bipolar memory cell having an improved diode load element.

2. Background Art

Bipolar memory cells are circuits wherein information may be stored in a low current stand-by mode and may be written into or read from in a higher current mode.

Some bipolar memory cells comprise a pair of cross-coupled multi-emitter transistors operating as a latch. The bases of the transistors are cross-coupled to each others collector. A first emitter of each transistor is coupled to a stand-by current drain line. A second emitter of one transistor is connected to a first bit line and a second emitter of the second transistor is connected to a second bit line. The collectors are further coupled to a row or column select line by a load.

The load implements the non-linear resistance required to maintain reasonable cell differential voltage under both the low current stand-by mode and the higher current read/write mode. Cell differential voltage is designed at typically between 350 and 700 millivolts during stand-by and provides sufficient noise immunity.

One previously known load arrangement comprises a PN diode in parallel with a resistor. The diode decreases the possibility of the transistors from going into heavy saturation. The read/write mode requires an increased current of 30 to 50 times that of the stand-by mode. In the stand-by mode, the differential voltage is low enough so that the diode is not turned on. In the read/write mode, the increased current goes through the diode instead of the resistor. Therefore, a higher current exists across the combination cell load elements for only a small increase in differential voltage. Typically, for one decade of additional current, an increase of only about 65 millivolts is obtained once the clamp diode is turned on.

Another previously known load arrangement comprises a PNP transistor as the load. First and second PNP transistors have their emitters connected to the select line. A collector of the first PNP transistor is connected to the base of the first multi-emitter transistor, the base of the second PNP transistor, and the collector of the second multi-emitter transistor. The base of the first PNP transistor is connected to the collector of the first multi-emitter transistor, the collector of the second PNP transistor, and the base of the second multi-emitter transistor. The second PNP transistor is similarly connected. A different version of this load arrangement has a first and second resistor coupled between the emitter and collector of the first and second PNP transistors, respectively.

Yet another previously known load arrangement comprises a diode formed in polysilicon. Such a diode has a slope factor, or diode ideality factor, of approximately two and results in a differential voltage greater than 200 millivolts, thereby producing a stable cell. This differential voltage can be retained over a wide current range so that the cell can still retain data at a very low current for power down operation.

Still another previously known load arrangement comprises a first PNP transistor having an emitter coupled to the select line, and a collector connected to the base of the first multi-emitter transistor. A second PNP transistor has an emitter connected to the select line and a collector connected to the base of the second multi-emitter transistor A third PNP transistor has an emitter coupled to the select line and a collector connected to the collector of the first multi-emitter transistor and the bases of both the first and third PNP transistors. A fourth PNP transistor has an emitter coupled to the select line and a collector connected to the collector of the second multi-emitter transistor and both the basis of the second and fourth PNP transistors.

All of the above previously known load arrangements have certain characteristics wherein it may be advantageous to use one instead of the other. However, all of these previously known load arrangements have a fundamental charge storage problem in the vertical PNP base region associated with the clamping diode of a resistor loaded cell and the injector of a PNP load cell. This charge storage results in long write pulse width and long write recovery times for these cells. In order to turn the cell off, the holes that have been injected into the epitaxial (epi) region, or collector of the multi-emitter transistor, must be removed and supplied to the side of the cell that is turning on.

This charge storage problem may be reduced by using a Schottky diode in place of the PN diode of the above mentioned load arrangement comprising a PN diode in parallel with a resistor. However, a Schottky diode loaded cell is disturb sensitive. The cell is subject to an accidental change of state, particularly at high temperatures.

Thus, what is needed is a memory cell having faster write pulse width and write recovery times by reducing the charge stored in the load epi region while avoiding the inherent disturb sensitivity of the Schottky diode loaded cell.

SUMMARY OF THE INVENTION

Accordingly, it is an object of the present invention to provide an improved memory cell.

Another object of the present invention is to provide a memory cell having faster write pulse width and write recovery times.

A further object of the present invention is to provide a memory cell having reduced charge stored in the epi region comprising the collector of the multi-emitter transistor.

Yet another object of the present invention is to provide a memory cell that is not sensitive to accidental changes of state.

In carrying out the above and other objects of the invention in one form, there is provided an improved memory cell having a first and a second multi-emitter NPN transistor wherein their bases are cross-coupled to each others collector in typical latch fashion. A first emitter of each is connected to a standby current drain line. A second emitter of each is connected to a first and a second bit line, respectively. A first PNP transistor has an emitter coupled to the select line, and a collector connected to the base of the first multi-emitter transistor. A second PNP transistor has an emitter connected to the select line and a collector connected to the base of the second multi-emitter transistor. A third NPN transistor has a base and a collector connected to the select line, and an emitter coupled to the collector of the first NPN transistor, the base of the second NPN transistor, and the collector of the second PNP transistor. A fourth NPN transistor has a base and a collector connected to the select line, and an emitter coupled to the collector of the second NPN transistor, the base of the first NPN transistor, and the collector of the first PNP transistor.

The above and other objects, features, and advantages of the present invention will be better understood from the following detailed description taken in conjunction with the accompanying drawing.

DETAILED DESCRIPTION OF THE INVENTION

Figure 1:
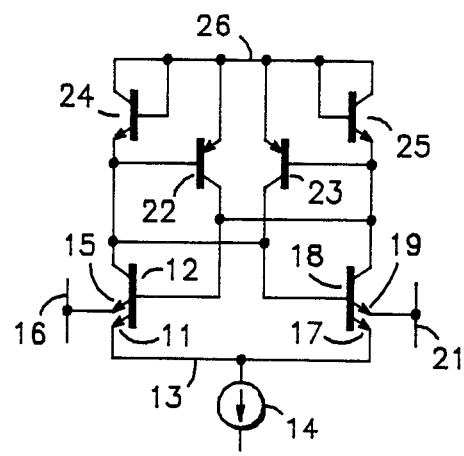
FIG. 1 is a schematic of the preferred embodiment of the invention.

Referring to FIG. 1, a memory cell in accordance with the present invention is shown which is suitable to be fabricated in monolithic integrated circuit form. Emitter 11 of multi-emitter NPN transistor 12 is connected to stand-by current drain line 13. Current source 14 is connected to stand-by current drain line 13 in a manner known to those skilled in the art. Emitter 15 of transistor 12 is connected to bit line 16. Emitter 17 of multi-emitter NPN transistor 18 is connected to stand-by current drain line 13 and emitter 19 of transistor 18 is connected to bit line 21. The base of transistor 12 is connected to the collector of transistor 18 and the collector of PNP transistor 22. The base of transistor 18 is connected to the collector of transistor 12 and the collector of PNP transistor 23.

NPN transistor 24 has its emitter connected to the collector of transistor 12 and the base of transistor 22. NPN transistor 25 has its emitter connected to the collector of transistor 18 and the base of transistor 23. Select line 26 is connected to the emitters of transistors 22 and 23 and to the collectors and bases of transistors 24 and 25.

When a logical low signal appears on bit line 16 and a logical high signal appears on bit line 21, transistor 12 is on and transistor 18 is off due to the respective voltages at their bases. When the low and high signals of the bitlines 16 and 21 are removed, the latched state is maintained by the low current from emitter 11 of transistor 12. When the signals on bit lines 16 and 21 are reversed, i.e. high and low respectively, transistor 12 is off and transistor 18 is on. When the high and low signals are removed, the latched state is maintained by the low current from emitter 17 of transistor 18.

Figure 2:
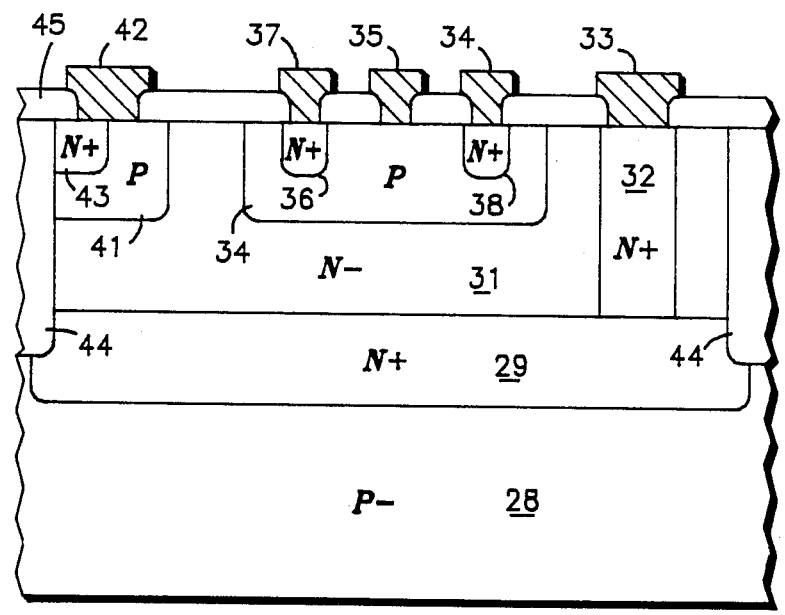
FIG. 2 is a cross-section of a portion of the schematic illustrated in FIG. 1.

The advantages of the present invention may be better understood by now referring to FIG. 2 which illustrates how a half cell, or transistors 12, 22, and 24 may be monolithically integrated in order to provide faster write pulse width and write recovery times. The integrated structure is fabricated utilizing conventional processes and includes a P− silicon substrate 28. N+ buried layer 29 is formed within substrate 28 and N− epitaxial layer 31 is grown over N+ buried layer 29. N+ region 32 is diffused into layer 31 and underlies metal contact 33 for providing the collector contact of transistor 12, the emitter contact of transistor 24, and the base contact of transistor 22. P region 34 is ion implanted into N− layer 31 and underlies metal contact 35 for providing the base contact of transistor 12 and and the collector contact of transistor 22. N+ 36 region is diffused in P region 34 and underlies metal contact 37 for providing emitter 15 contact of transistor 12. N+ region 38 is diffused in P region 34 and underlies metal contact 39 for providing emitter 11 contact of transistor 12.

P region 41 is ion implanted into N− region 31 and underlies metal contact 42 for providing the base contact of transistor 24 and the emitter contact of transistor 22. N+ region 43 is diffused into P region 41 and underlies metal contact 42 for providing the collector contact of transistor 24.

This portion of the monolithically integrated circuit may be electrically isolated from the remaining chip in a manner known to those skilled in the art by diffused isolations 44. Dielectric layer 45 overlies the chip also in a manner known to those skilled in the art.

Previously known load arrangements for memory cells, except for the Schottky diode loaded cell, have significant charge storage occurring in the lightly doped N epi region and lesser amounts in the more heavily doped buried layer region of the cell. When the cell clamping diode turns on, it turns on the vertical PNP device which requires a significant amount of base charge (diffusion capacitance) in the on condition.

Transistors 24 and 25 are normal NPN transistors operating in the reverse active mode. The base is shorted to the collector via metal 42. Transistor 24 or 25 in combination with transistor 22 or 23, respectively, has less charge storage than transistor 22 or 23 acting alone because the electric field in P region 41, which forms a barrier to electron flow from N− region 31 into metal 42, has been lowered via N+ region 43. This barrier is proportional to the integral of the P doping from the interface between N− region 31 and P region 41 up to the interface between metal 42 and P region 41 when N+ region 43 is not present. When N+ region 43 is present, this barrier is proportional to the integral of the P doping from the interface between N− region 31 and P region 41 up to the interface between P region 41 and N+ region 43. This reduced electric field barrier to electron flow reduces the amount of forward bias across the base emitter of PNP transistor 22 or 23 which is necessary to support a given amount of memory cell hold or read current. This reduced forward bias results directly in less hole storage in N− region 31 and N+ region 29 of the cell at the given cell current level. The Schottky loaded cell reduces this charge storage but has such a low turn on voltage which reduces cell noise margin and causes the cell to be disturb sensitive. Transistor 24 or 25, comprising N+ region 43, P region 41 and N− layer 31, has a higher voltage margin, or higher noise margin, than the Schottky loaded cell.

Figure 3:
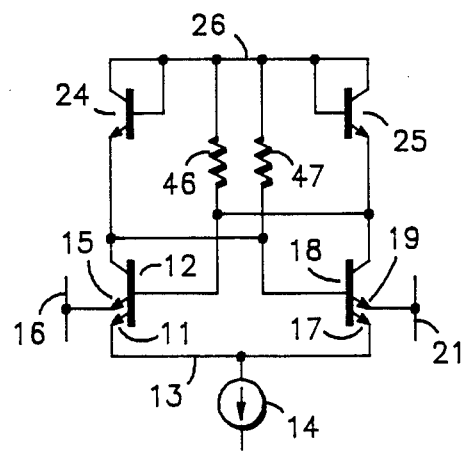
FIG. 3 is a schematic of a second embodiment of the invention.
Figure 4:
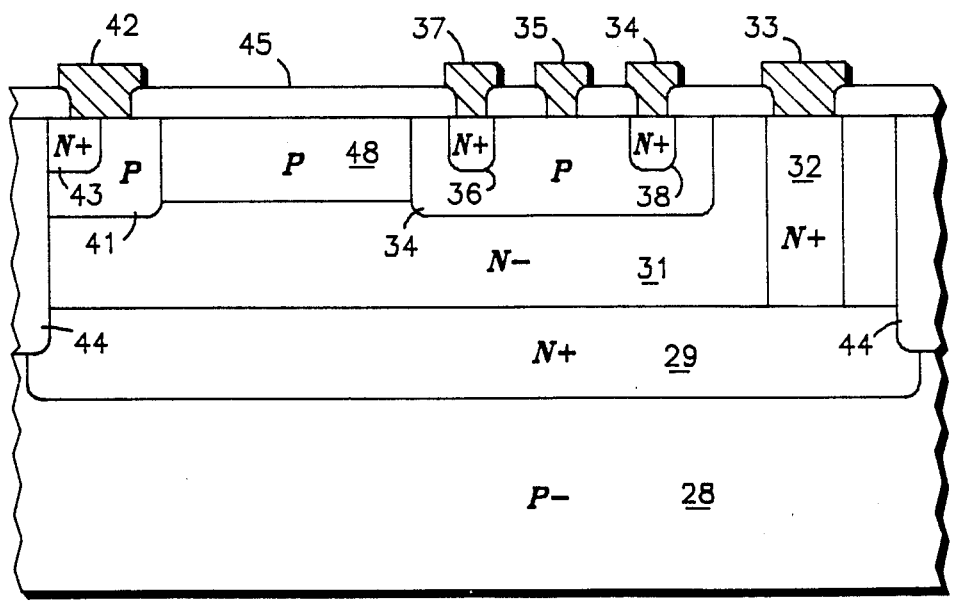
FIG. 4 is a cross-section of a portion of the schematic illustrated in FIG. 2.

Referring now to FIGS. 3 and 4, a second embodiment is shown wherein several components are the same and are numbered with identical numbers. Transistors 22 and 23 of FIG. 1 have been replaced by resistors 46 and 47, respectively. Resistor 46 is coupled between select line 26 and the base of transistor 12, the collector of transistor 18, and the emitter of transistor 25. Resistor 47 is coupled between select line 26 and the base of transistor 18, the collector of transistor 12, and the emitter of transistor 24. Resistor 46 comprises diffused P region 48 in FIG. 4. Note that transistor 22, comprising P region 41, N— layer 31 and P region 34, inherently exists in the half cell of FIG. 4.

By now it should be appreciated that there has been provided a bipolar memory cell with an improved diode load element having faster write pulse width and write recovery times. A reduced charge is stored in the epi region which comprises the collector of the multi-emitter transistor.

I claim:

1. An improved bipolar memory cell having first and second multi-emitter cross-coupled transistors and first means for implementing a non-linear resistance coupled between a select line and both a base of said first multi-emitter transistor and a collector of said second multi-emitter transistor, and second means for implementing a non-linear resistance coupled between said select line and both a base of said second multi-emitter transistor and a collector of said first multi-emitter transistor, wherein the improvement comprises a first NPN transistor having a collector and a base coupled to said select line and an emitter coupled to said collector of said first multi-emitter transistor; and a second NPN transistor having a collector and a base coupled to said select line and an emitter coupled to said collector of said second multi-emitter transistor.

2. The improved bipolar memory cell according to claim 1 wherein said first means and said second means comprise a first and a second PNP transistor, said first PNP transistor having a base coupled to said collector of said first multi-emitter transistor and said emitter of said first NPN transistor, said second PNP transistor having a base coupled to said collector of said second multi-emitter transistor and said emitter of said second NPN transistor.

3. The improved bipolar memory cell according to claim 1 wherein said first means and said second means are resistors.

4. The improved bipolar memory cell according to claim 2 wherein each of both said first NPN transistor and said first PNP transistor, and both said second NPN transistor and said second PNP transistor comprise a monolithically integrated structure comprising:
   a first region having a first conductivity type;
   a second region having a second conductivity type formed at a surface of and within said first region;
   a third region having said first conductivity type formed at a surface of and within a first portion of said second region;
   a fourth region having said first conductivity type formed at a surface of and within a second portion of said second region;
   a fifth region having said second conductivity type formed at a surface of and within said third region;
   a sixth region having said second conductivity type formed at a surface of and within a first portion of said fourth region;
   a seventh region having said second conductivity type formed at a surface of and within a second portion of said fourth region; and
   an eighth region formed at a surface of at least a portion of said third region and a portion of said fifth region, said eight region comprising a conductive material.

5. The improved bipolar memory cell according to claim 3 wherein each of both said first NPN transistor and one of said resistors, and both said second NPN transistor and the other of said resistors comprise a monolithically integrated structure comprising:
   a first region having a first conductivity type;
   a second region having a second conductivity type formed at a surface of and within said first region;
   a third region having said first conductivity type formed at a surface of and within a first portion of said second region;
   a fourth region having said first conductivity type formed at a surface of and within a second portion of said second region;
   a fifth region having said second conductivity type formed at a surface of and within said third region;
   a sixth region having said second conductivity type formed at a surface of and within a first portion of said fourth region;
   a seventh region having said second conductivity type formed at a surface of and within a second portion of said fourth region;
   an eighth region formed at a surface of at least a portion of said third region and a portion of said fifth region, said eight region comprising a conductive material; and
   a ninth region having said first conductivity type formed at a surface of and within a third portion of said second region, said ninth region contiguously positioned between said third region and said fourth region.

6. The improved bipolar memory cell according to claim 4 further comprising a ninth region having a second conductivity type, said ninth region being more heavily doped than said second region, said ninth region formed at a surface of and within said first region, and said second region formed at a surface of said ninth region.

7. The improved bipolar memory cell according to claim 5 further comprising a tenth region having a second conductivity type, said tenth region being more heavily doped than said second region, said tenth region formed at a surface of and within said first region, and said second region formed at a surface of said tenth region.

8. The improved bipolar memory cell according to claim 6 further comprising a tenth region having a second conductivity type, said tenth region being more heavily doped than said second region, said tenth region formed at a portion of a surface of said ninth region and extending through said second region to a third portion thereof.

9. The improved bipolar memory cell according to claim 7 further comprising an eleventh region having a second conductivity type, said eleventh region being more heavily doped than said second region, said eleventh region formed at a portion of a surface of said tenth region and extending through said second region to a fourth portion thereof.

10. A memory cell having a first bit line, a second bit line, a select line, and a stand-by current line, comprising:
   a first transistor having a base, a collector, a first emitter, and a second emitter, said first emitter coupled to said first bit line, said second emitter coupled to said stand-by current line;
   a second transistor having a base, a collector, a first emitter, and a second emitter, said first emitter coupled to said second bit line, said first emitter coupled to said second bit line, said second emitter coupled to said stand-by current line, said base coupled to said collector of said first transistor and said collector coupled to said base of said first transistor;

first means for implementing a non-linear resistance coupled between said select line and both a base of said first transistor and a collector of said second transistor;

second means for implementing a non-linear resistance coupled between said select line and both a base of said second transistor and a collector of said first transistor;

a third transistor having a base and a collector coupled to said select line, and an emitter coupled to said collector of said first transistor and said base of said second transistor; and a fourth transistor having a base and a collector coupled to said select line, and said emitter coupled to said base of said first transistor and said collector of said second transistor.

11. A monolithically integrated memory cell including two half cells, wherein each of said half cells comprise:

a first region having a first conductivity type;

a second region having a second conductivity type formed at a surface of and within said first region;

a third region having said first conductivity type formed at a surface of and within a first portion of said second region;

a fourth region having said first conductivity type formed at a surface of and within a second portion of said second region;

a fifth region having said second conductivity type formed at a surface of and within said third region;

a sixth region having said second conductivity type formed at a surface of and within a first portion of said fourth region;

a seventh region having said second conductivity type formed at a surface of and within a second portion of said fourth region; and an eighth region overlying at least a portion of said third region and said fifth region, said eighth region comprising a conductive material.

12. The monolithically integrated memory cell according to claim 11, further comprising a ninth region having said first conductivity type formed at a surface of and within a third portion of said second region, said ninth region positioned contiguously between said third region and said fourth region.

13. The monolithically integrated memory cell according to claim 11, further comprising:

a ninth region having a second conductivity type, said ninth region being more heavily doped than said second region, said ninth region formed at a surface of and within said first region, and said second region formed at a surface of said ninth region; and a tenth region having a second conductivity type, said tenth region being more heavily doped than said second region, said tenth region formed at a portion of a surface of said ninth region and extending through said second region to a third portion thereof.

14. The monolithically integrated memory cell according to claim 12, further comprising:

a tenth region having a second conductivity type, said tenth region being more heavily doped than said second region, said tenth region formed at a surface of and within said first region, and said second region formed at a surface of said tenth region; and an eleventh region having a second conductivity type, said eleventh region being more heavily doped than said second region, said eleventh region formed at a portion of a surface of said tenth region and extending through said second region to a third portion thereof.

* * * * *